United States Patent
Blick et al.

(10) Patent No.: US 7,041,611 B2
(45) Date of Patent: May 9, 2006

(54) ENHANCEMENT OF FABRICATION YIELDS OF NANOMECHANICAL DEVICES BY THIN FILM DEPOSITION

(75) Inventors: Robert H. Blick, Madison, WI (US); Daniel R. Koenig, Munich (DE)

(73) Assignee: Wisconsin Alumni Research Foundation, Madison, WI (US)

( * ) Notice: Subject to any disclaimer, the term of this patent is extended or adjusted under 35 U.S.C. 154(b) by 36 days.

(21) Appl. No.: 10/802,259

(22) Filed: Mar. 17, 2004

(65) Prior Publication Data

US 2005/0205856 A1    Sep. 22, 2005

(51) Int. Cl.
    *H01L 21/00*    (2006.01)
(52) U.S. Cl. ................. 438/900; 438/51; 438/55; 438/64; 438/106; 438/115; 438/116; 438/125
(58) Field of Classification Search ............... 438/51, 438/55, 64, 106, 115, 116, 125
    See application file for complete search history.

(56) References Cited

U.S. PATENT DOCUMENTS

| | | | |
|---|---|---|---|
| 5,970,315 A * | 10/1999 | Carley et al. ............. | 438/52 |
| 6,379,988 B1 * | 4/2002 | Peterson et al. ........... | 438/51 |
| 6,404,028 B1 * | 6/2002 | Hetrick et al. ............ | 257/415 |
| 6,589,717 B1 | 7/2003 | Ghandehari et al. | |

OTHER PUBLICATIONS

M.L. Roukes, "Nanoelectromechanical Systems Face the Future," Physics World 14, No. 25, Feb. 2001.
D.V. Scheible, A. Erbe and R.H. Blick, "Tunable Coupled Nanomechanical Resonators for Single-Electron Transport," New J. Phys., 4, 2002, pp. 86.1-86.7.
N.V. Lavrik and P.G. Datskos, "Femtogram Mass Detection Using Photothermally Actuated Nanomechanical Resonators," Appl. Phys. Lett., vol. 82, No. 16, Apr. 21, 2003, pp. 2697-2699.
A. Erbe, C. Weiss, W. Zwerger and R.H. Blick, "Nanomechanical Resonator Shuttling Single Electrons at Radio Frequencies," Phys. Review Lett., vol. 87, No. 9, Aug. 27, 2001, pp. 096106-1-096106-4.
X.M.H. Huang, C.A. Zorman, M. Mehregany and M.L. Roukes, "Nanodevice Motion at Microwave Frequencies," Nature (London), vol. 421, Jan. 30, 2003, p. 496.

(Continued)

Primary Examiner—Mai-Huong Tran
(74) Attorney, Agent, or Firm—Foley & Lardner LLP

(57) ABSTRACT

A protective film is applied onto a nanostructural feature supported on a sacrificial layer by energy beam assisted deposit of material from a vapor through which the beam passes. A wet etchant is applied to etch away the sacrificial layer beneath the nanostructural feature to leave it suspended as a cantilever or bridge. The film protects the structural feature from damage during etching, and may be removed after the wet etching process is completed.

39 Claims, 4 Drawing Sheets

OTHER PUBLICATIONS

A.N. Cleland and M.L. Roukes, "Fabrication of High Frequency Nanometer Scale Mechanical Resonators from Bulk Si Crystals," Appl. Phys. Lett., vol. 69, No. 18, Oct. 28, 1996, pp. 2653-2655.

B. Ilic, D. Czaplewski and H.G. Craighead, "Mechanical Resonant Immunospecific Biological Detector," Appl. Phys. Lett., vol. 77, No. 3, Jul. 17, 2000, pp. 450-452.

M. Wendel, H. Lorenz and J.P. Kotthaus, "Sharpened Electron Beam Deposited Tips for High Resolution Atomic Force Microscope Lithography and Imaging," Appl. Phys. Lett., vol. 67, No. 25, Dec. 18, 1995, pp. 3732-3734.

C.T.-C. Nguyen, "Frequency-Selective MEMS for Miniaturized Low-Power Communication Devices," IEEE Trans. Microwave Theory Tech., vol. 47, No. 8, Aug. 1999, pp. 1486-1503.

* cited by examiner

US 7,041,611 B2

ENHANCEMENT OF FABRICATION YIELDS OF NANOMECHANICAL DEVICES BY THIN FILM DEPOSITION

FIELD OF THE INVENTION

This invention pertains generally to the field of nanomachined devices and more particularly to enhancement of yield in the formation of such devices.

BACKGROUND OF THE INVENTION

Significant efforts have been devoted to the development of miniaturized mechanical devices and particularly to devices that are well suited to be integrated with semiconductor electronic components. Processing techniques similar to those used in integrated circuit manufacturing may be utilized to produce miniaturized mechanical components which have a wide variety of practical applications, including pressure sensors and other types of sensors, micromechanical electrical switches, resonators and filters, and on-chip mass spectrometers, among many other applications. Such microminiaturized mechanical and electrical devices are commonly referred to as microelectromechanical systems (MEMS). As improvements in manufacturing technology have allowed the continual reduction in size of electronic semiconductor components, micromechanical devices have similarly been developed with progressively smaller feature sizes. Electromechanical devices which have feature sizes less than a micrometer and down to a few nanometers are sometimes referred to as nanoelectromechanical systems (NEMS).

In the manufacturing of MEMS and NEMS devices, a typical step in the process involves the deposition or formation of a patterned structure on a sacrificial layer, followed by wet etching of the sacrificial layer to free the mechanical structure and allow it to be suspended as a bridge or cantilever. As the cross-sectional size of these suspended structures is reduced, particularly into the range of a fraction of a micrometer, serious problems are encountered which significantly reduce the yield of good devices that are obtained after the processing is completed. A primary problem is that the wet etchants used to etch out the sacrificial layer beneath the desired structure may attack and partially dissolve the material of the desired structure. For example, for silicon structures formed on a silicon dioxide sacrificial layer, the wet etchants used to dissolve the sacrificial layer will, to some degree, also attack and dissolve the silicon. The amount of material removed generally is of little or no consequence with respect to suspended structures having dimensions in the range of several hundred or several thousand nanometers. However, where the suspended structures have very small cross-sectional dimensions (height or width or both) in the range of a few hundred nanometers or less, the wet etchant can attack and damage a significant portion of the material of the silicon suspended structure during the time required to completely etch away the silicon dioxide sacrificial layer. Another problem encountered with very fine featured suspended structures is that the structures may collapse or sag during the production process as the wet etchant is being removed, possibly causing permanent bending of the suspended structure, or even adhesion of the suspended structure to the underlying substrate if it touches the substrate. The net result is that the yield (the proportion of good devices compared to useless devices formed during processing) drastically decreases as the feature size of the micromechanical structures decreases.

SUMMARY OF THE INVENTION

In accordance with the present invention, the formation of nanomechanical structures is carried out in a manner which significantly increases the yield of usable devices obtained after the processing is completed. The present invention allows the formation of nanomechanical structures having suspended structural features with dimensions of a few hundred nanometers and less, and particularly structures having a cross-sectional dimension of 500 nm or less, with a stabilization of the suspended structures during processing to ensure structural stability and avoid collapse of the suspended structures. The nanomechanical structures produced by the present invention experience very little structural damage during processing, enabling the development of nanomechanical structures having finer and more complex geometric features.

In a method of forming nanomechanical structures in accordance with the invention, a nanomechanical structural feature is provided which is supported on a layer of sacrificial material and connected to a larger structural element. A film is applied onto the structural feature by energy beam assisted deposit of material from a vapor through which the beam passes to cover the structural feature. The energy beam is preferably an electron beam, and other types of energy beams such as visible and ultraviolet laser light, x-rays, etc. may be utilized. The beam is preferably scanned over the structural feature, transporting molecules from the vapor and depositing them in a film onto the structural feature. A preferred vapor includes carbon-containing organic molecules such that the film deposited on the structural feature is comprised primarily of carbon. A wet etchant is applied to the structural feature covered by the film and to the sacrificial layer supporting the structural feature. The wet etchant is selected to etch the sacrificial layer material preferentially as compared to the structural feature and the film covering it to leave the structural feature supported by its connection to the larger structural element. The covering film is then removed from the structural feature.

The present invention is particularly well suited to be carried on semiconductor material such as silicon, facilitating the integration of nanomechanical structures with conventional electronic devices formed on the semiconductor substrates. Where the nanomechanical structural features are formed of silicon, a preferred sacrificial layer material is silicon dioxide which can be wet etched by various etchants such as buffered hydrofluoric acid. A protective film comprising primarily carbon will also resist such wet etchants, thus providing excellent protection of the silicon nanostructural features during the wet etching process in which the sacrificial layer is etched away to free the nanomechanical structure. The carbon film is readily formed on the nanostructural features by scanning an electron beam over the nanostructural feature, for example, an electron beam from a scanning electron microscope or from e-beam lithography equipment. The covering film may be removed from the nanostructural feature in various ways without damaging either the nanostructural feature or other adjacent structures. For example, where the covering film is formed primarily of carbon, oxygen plasma etching can be carried out to remove the carbon film without substantially affecting the silicon nanostructural feature or adjacent features such as the structure to which it is connected.

The present invention may also be carried out by depositing a film on structural features that are not supported by a sacrificial layer so that the film protects the integrity of the structural features or holds the features in place during wet etching or other processing of other portions of a base such as a semiconductor chip. The film can be removed as discussed above after the etching or other processing has been completed.

Further objects, features and advantages of the invention will be apparent from the following detailed description when taken in conjunction with the accompanying drawings.

DETAILED DESCRIPTION OF THE INVENTION

The present invention may be utilized with any semiconductor manufacturing processes in which a sacrificial layer is used to support a nanostructural member before the sacrificial layer is removed by wet etching. Sacrificial layers may be formed of a variety of materials, with the sacrificial layer material being etchable by a wet etchant in preference to the structural material supported by the sacrificial layer as well as in preference to adjacent structures with which the liquid etchant comes into contact. The present invention may also be used more generally to protect structural features and/or hold them in place during wet etching or other processing steps. In general, the invention may be utilized with various base substrates including semiconductor substrates such as crystalline silicon, germanium, silicon-germanium, gallium arsenide, indium phosphide, etc. Sacrificial layers are commonly formed of oxides of the semiconductor, but may be formed of other semiconductors which are differentially etched, metals, etc.

Figure 1:
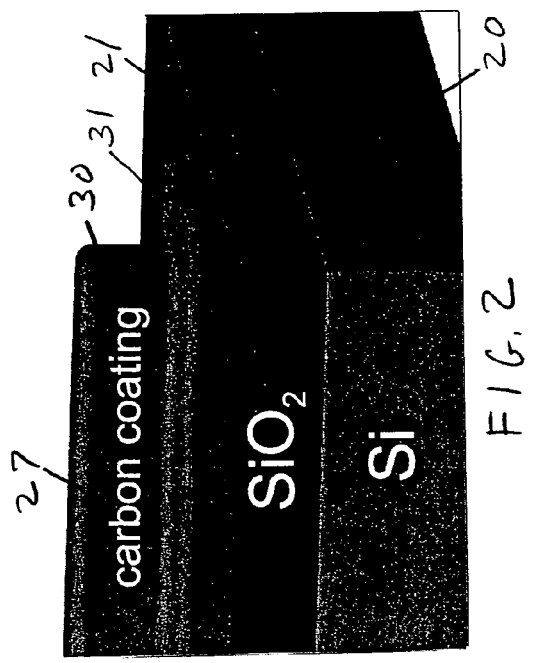
FIG. 1 is a simplified perspective view of an illustrative nanostructural feature supported on a sacrificial layer.
Figure 5:
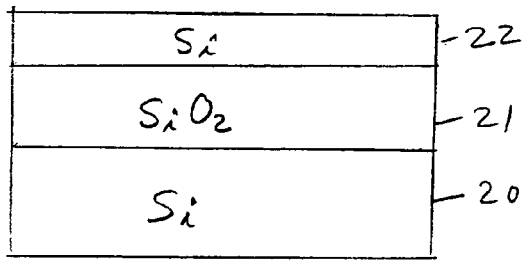
FIG. 5 is a simplified cross-sectional view of a multi-layer silicon on insulator (SOI) base material on which nanostructures can be formed.
Figure 7:
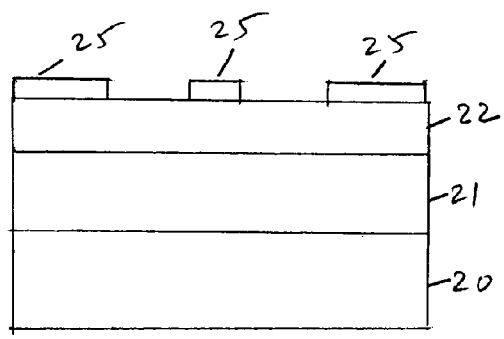
FIG. 7 is a cross-sectional view of the structure of FIG. 6 taken along the line 7—7 of FIG. 6.
Figure 6:
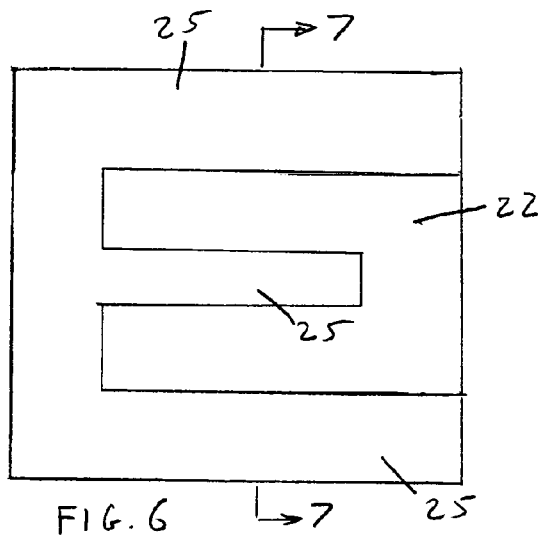
FIG. 6 is a plan view of an SOI chip as in FIG. 5 on which a layer of metal has been deposited on the top silicon layer.
Figure 8:
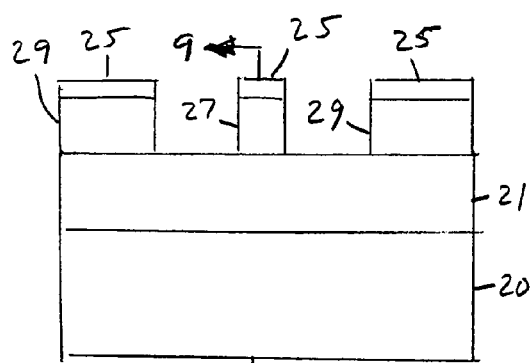
FIG. 8 is a cross-sectional view of the structure of FIG. 7 after etching is carried out to etch the top silicon layer down to the silicon dioxide sacrificial layer.
Figure 9:
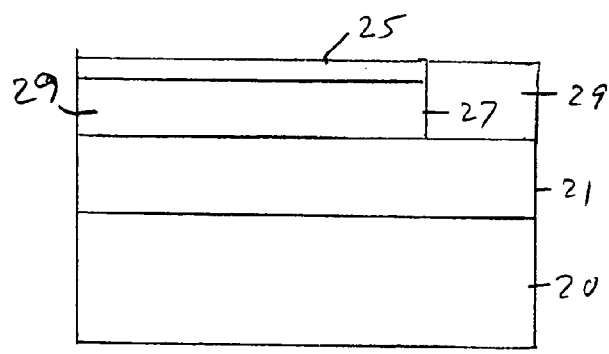
FIG. 9 is a cross-sectional view of the structure of FIG. 8 taken along the line 9—9 of FIG. 8.

For purposes of exemplifying the invention, the formation of microstructures is described below utilizing a silicon on insulator (SOI) base material which, as illustrated in FIG. 5, comprises a substrate 20 of crystalline silicon, a layer of silicon dioxide 21 (the insulator) and a top layer 22 of crystalline silicon formed over the silicon dioxide 21. In a typical initial step, as shown in FIGS. 6 and 7, a metal layer 25 is deposited on the top silicon layer 22 and patterned, and the underlying silicon layer 22 is etched, e.g., by anisotropic reactive ion etching, as shown in FIGS. 8 and 9 to leave a nanostructural feature or features 27 which may be connected at one or more locations to larger surrounding features 29. The processing up to FIGS. 8 and 9 provides a nanostructural feature 27 supported on the silicon dioxide sacrificial layer 21, as illustratively shown in perspective view in FIG. 1. FIGS. 8 and 9 also illustrate the isolated nanostructural feature spaced from but adjacent to other features 29.

Figure 2:
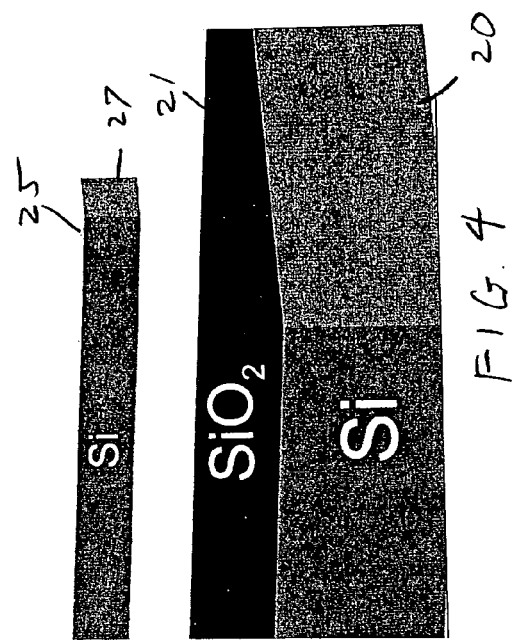
FIG. 2 is a view of the structure of FIG. 1 after a protective film has been deposited on the nanostructural feature.
Figure 3:
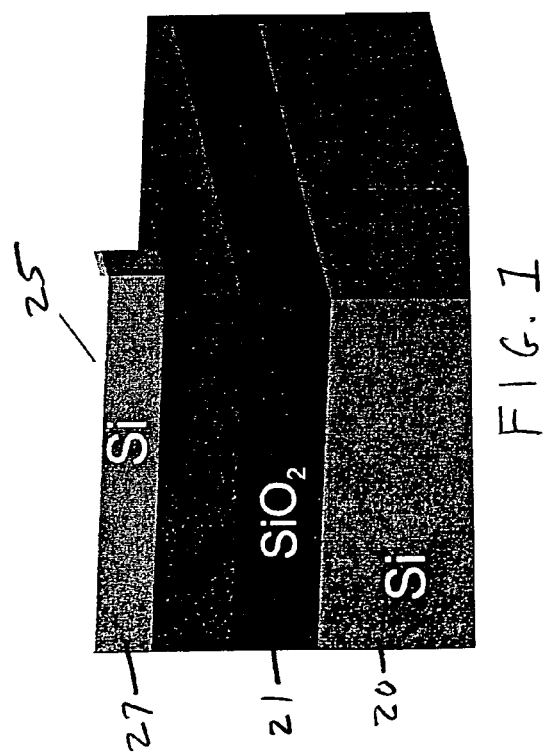
FIG. 3 is a perspective view of the structure of FIG. 2 after applying a wet etchant to etch away the sacrificial layer beneath the nanostructural feature to free the nanostructural feature and leave it suspended.
Figure 4:
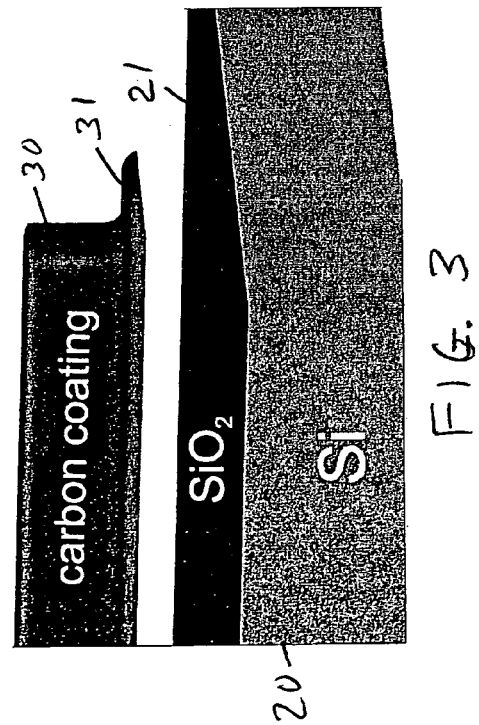
FIG. 4 is a perspective view of the structure of FIG. 3 after removal of the protective film from the nanostructural feature.
Figure 10:
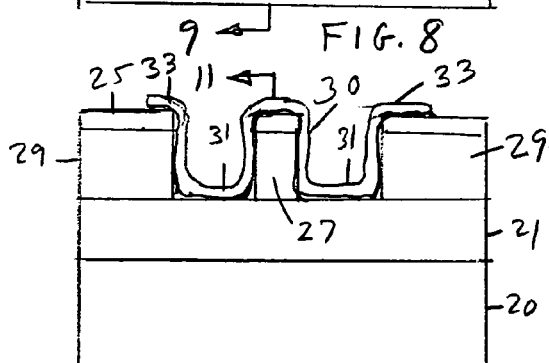
FIG. 10 is a view of the structure of FIG. 8 after deposit of a protective covering film in accordance with the invention.
Figure 11:
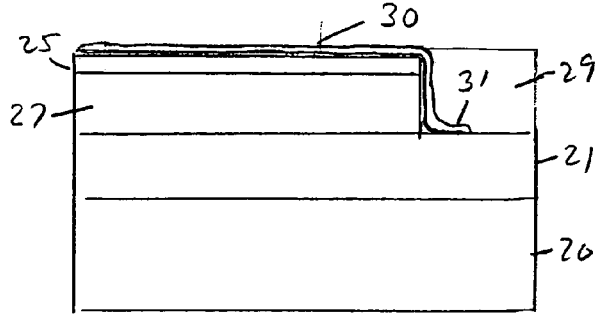
FIG. 11 is a cross-sectional view of the structure of FIG. 10 taken along the line 11—11 of FIG. 10.
Figure 15:
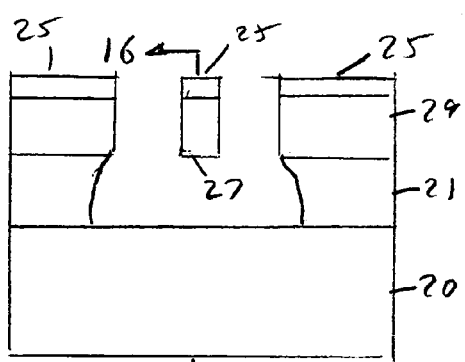
FIG. 15 is a view of the structure of FIG. 13 after removal of the protective covering film.
Figure 16:
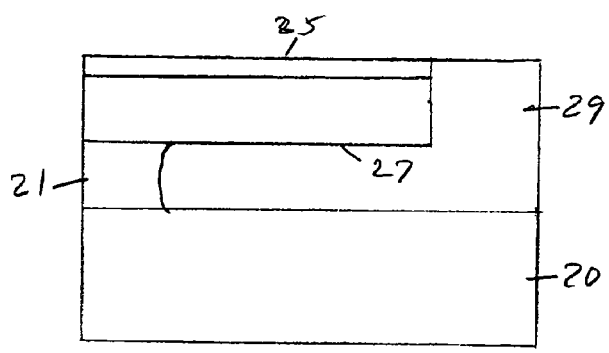
FIG. 16 is a cross-sectional view of the structure of FIG. 15 taken along the line 16—16 of FIG. 15.

In accordance with the invention, a protective film 30 is then deposited over the nanostructural feature 27. The protective film may also have a portion 31 that extends out around the nanostructural feature over a portion of the insulating layer 21, as illustrated in FIG. 2, and the extending portion 31 may cover the sacrificial layer 21 between the feature 27 and adjacent features 29 as illustrated in FIG. 10. As shown in FIG. 10, the protective film 31 may also cover the sidewalls and have a portion 33 that covers at least part of the top surface of adjacent larger structures 29. A wet etchant is then applied that etches the silicon dioxide in preference to either the silicon forming the nanostructural feature 27 or the adjacent larger features 29. The protective film 30 is also preferably resistant to the wet etch. The result of the etching is illustrated in FIGS. 3 and 12–14, with the nanostructural feature 27, covered by the film 30, freed from the sacrificial layer 21 and suspended above it. The thin film or web 31 between the feature 27 and the adjacent feature(s) 29 helps to stabilize the position of the nanostructural feature 27 by virtue of the mechanical connection it provides to the adjacent larger structural features. In a final step, the protective film 30 is then removed to leave the nanostructural feature uncovered and in free suspension, as illustrated in FIGS. 4 and 15–16.

A specific example for purposes of illustrating the forming of nanomechanical structures in accordance with the invention is described below and with reference to FIGS. 17–20.

Figure 18:
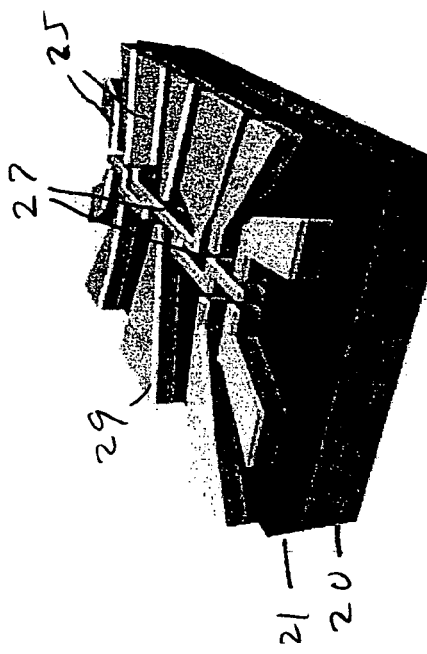
FIG. 18 is a perspective view of the structure of FIG. 17 after an initial etching step.
Figure 17:
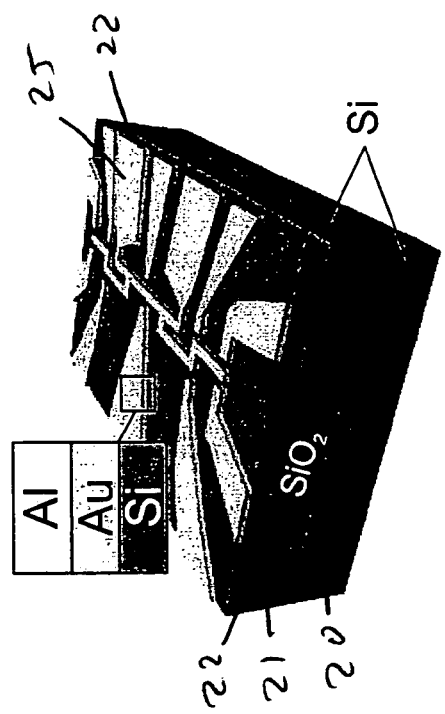
FIG. 17 is a perspective view of an illustrative example of a nanomachined structure at an initial stage.
Figure 19:
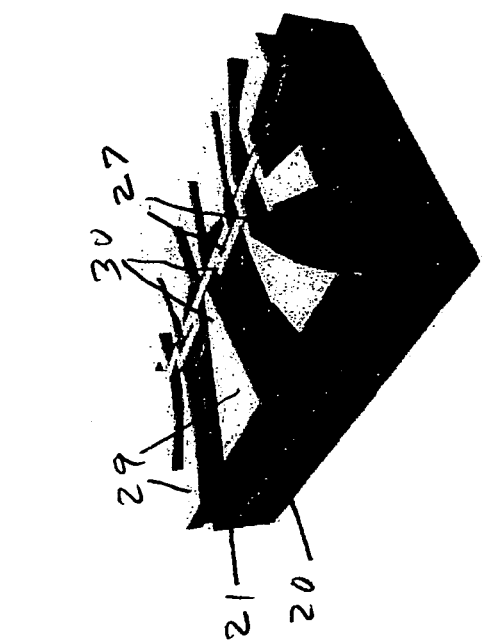
FIG. 19 is a view of the structure of FIG. 18 after under-etching of the nanostructural features protected by the protective film of the invention.

An SOI chip was obtained which was composed of three layers: a silicon substrate 20, a 400 nm silicon dioxide layer 21, and a 200 nm silicon top layer 22. A resist was spin-coated on the chip surface, and the desired structure was written into the resist with a scanning electron microscope (SEM), and the exposed area was developed. After these steps, a 2 nm layer of titanium, a 10 nm layer of gold, and a 10 nm layer of aluminum were deposited onto the exposed surface of the chip by means of thermal evaporation. Hot acetone was used to lift off the unexposed resist and the metal above it to leave a metal structure 25 on top of the SOI chip as shown in FIG. 17. Reactive ion etching (RIE) was then used to vertically etch through the 200 nm top silicon layer 22 and into the silicon dioxide layer 21. The aluminum top layer of the metal structure 25 shields the gold and silicon areas beneath it from the RIE etching to leave the structure as illustrated in FIG. 18. These etching processes may be carried out in a conventional manner, as described in, for example, A. Erbe, et al., Phys. Rev. Lett., Vol. 87, 2001, pp. 096106, et seq.; D. V. Scheible, et al., New J. Phys., Vol. 4, 2002, pp. 86.1, et seq. In the present invention, an energy beam deposition process is used to form a protective film 30 on the nanostructural feature 27 and desired adjacent features. In the present example, a film deposition was carried out by placing the SOI chip in the sample chamber of a scanning electron microscope (LEO 982, LEO Electron Microscopy, Inc.) and then scanning and focusing the electron beam onto the nanostructural features for about 10 to 30 seconds. The SEM electron beam acceleration voltage was 8 kV, the aperture was 30 microns in diameter, the beam current was about 54 pA, and the magnification was set to ×37000. As the electron beam is scanned over the nanostructural features in the SEM, residual gas atoms present in the vacuum chamber are gettered onto the areas hit by the electron beam. The material in the deposited film comprises mostly carbon, which originates from organic vapor molecules in the SEM chamber. These organic molecules typically come from lubricants used in the pumps and other mechanical parts of the SEM system and may be naturally found in the sample vacuum chamber of the SEM. M. Wendel, Appl. Phys. Lett., Vol. 67, 1995, pp. 3732, et seq. The result of scanning the electron beam over the area encompassing the nanomechanical parts is the deposit of a carbon protective layer 30 onto the microstructure. The thickness of the layer depends on the deposition time, the composition of the gas vapor in the sample chamber, and the energy, current and focusing area of the electron beam.

A wet etchant, buffered hydrofluoric acid, was then applied to the chip to etch away the sacrificial layer 21 and free the nanostructural part 27 from the sacrificial layer. In the present invention, the carbon film 30 protects the nanostructural feature 27 from being etched, but allows the etchant to etch out the sacrificial layer 21 beneath the protected nanostructural feature, thus allowing the nanostructural feature to be freed without damage to the silicon material of the nanostructural feature.

Figure 12:
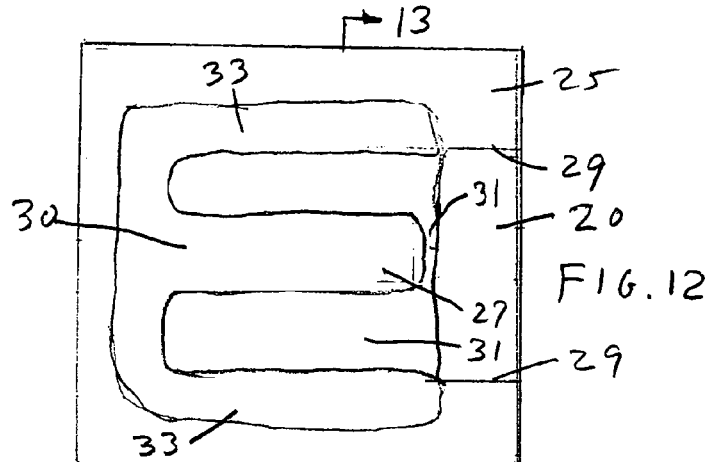
FIG. 12 is a plan view of the structure of FIGS. 10 and 11 after applying a wet etchant to remove the silicon dioxide sacrificial layer beneath the nanostructural feature.
Figure 13:
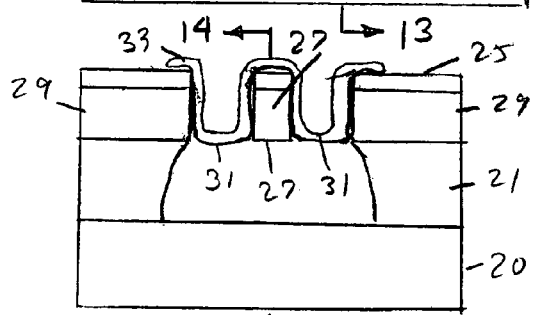
FIG. 13 is a cross-sectional view of the structure of FIG. 12 taken along the line 13—13 of FIG. 12.
Figure 14:
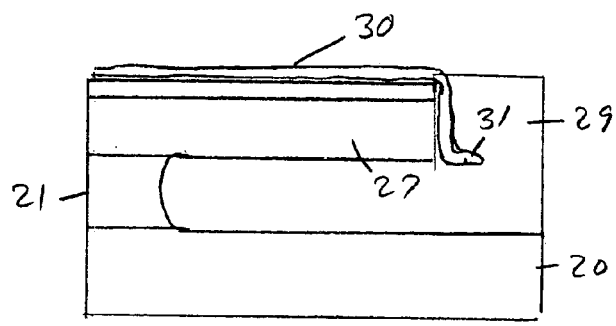
FIG. 14 is a cross-sectional view of the structure of FIG. 13 taken along the line 14—14 of FIG. 13.

As noted above, a problem associated with the fabrication of NEMS features is that such features lose rigidity during the wet etch step and become prone to damage induced by the surface tensions of liquids. Using the electron beam to apply a sufficiently thick carbon layer 30 on the structural features can create an extending portion of deposited material that forms a thin film or web 31, as illustrated in FIGS. 12 and 13, that bridges and interconnects closely spaced parts and serves as structural reinforcement. When the NEMS feature 27 becomes freely suspended after wet etching, the interconnecting layer 31 serves to increase the overall stability of the defined features and prevent sagging and distortion of the nanostructural features.

Figure 20:
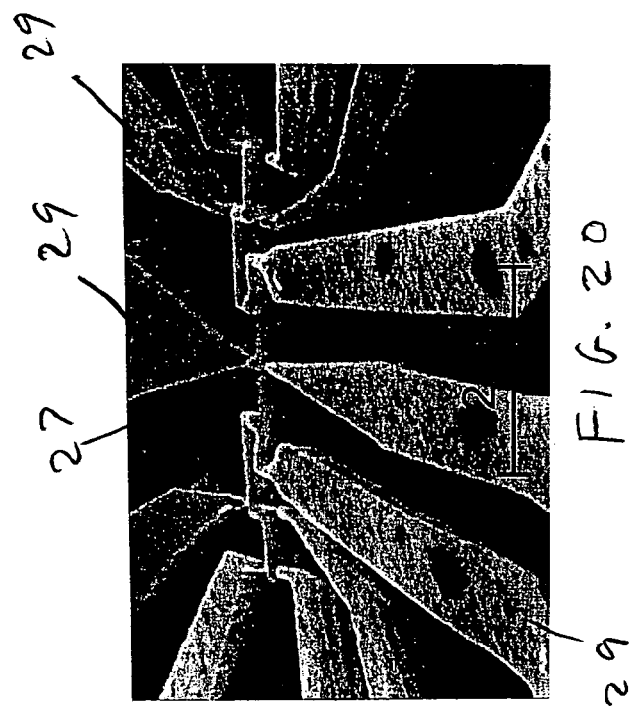
FIG. 20 is a photomicrograph of an actual microstructure having the geometric form of FIG. 19 illustrating the suspended nanostructural features connected to larger adjacent features.

Generally, the carbon protective film 30 is not a desired feature of the final device as it may influence the mechanical and electrical properties of the structure. The carbon film 30 may readily be removed using oxygen plasma etching. The technique of oxygen plasma etching utilizes a high frequency field to ionize oxygen and create oxygen radicals which react with organic material, such as the carbon film 30 to form carbon dioxide and water. In the specific example discussed above, the instrument utilized for oxygen plasma etching was a Lab Ash 100 from RF Applications Ltd., Eastbourne, Sussex, England. The parameters used in the wet etch step were: operation pressure—2 Torr; power—40 Watts; etch time-in the range of 40 seconds to 180 seconds. After removal of the protective carbon film, a structure was left as shown in FIG. 20 in which the nanostructural features 27 were suspended above the remaining portion of the sacrificial layer and connected to larger structures 29 which remain supported by the sacrificial layer.

In an experiment, 55 structures having geometric features similar to that shown in FIGS. 17–20 were processed through the wet etch step. In the 33 cases in which a protective film 30 was not used, the nanostructural features were strongly damaged by the hydrofluoric acid etchant. The other 22 cases utilized a protective film 30 of carbon as discussed above and were found to be undamaged during the wet etch step, essentially a 100% increase in yield through this etching step. Further experiments were run in which structures with and without the protective film 30 were processed on the same SOI chip with the same wet etch step. Only the structures that had been coated with the carbon film were found to be protected from etch damage.

The invention may also be carried out to hold structural features in place on a base surface while other processing is carried out. For example, the structural features may be formed as described above with the protective film covering both a portion of the feature and a portion of a surface of an adjacent base structure. After the sacrificial layer under the feature is etched away, it will be held in place by the film which connects the feature to the base surface, allowing processing to take place on other parts of the base without disturbing the structural features. Further, the structural features can also be formed separately (e.g., nanoparts formed by other processes) and be deposited on a base surface, with a protective film being applied as discussed above to at least a portion of the structural feature and an adjoining portion of the base surface to hold the feature in place while other processing is carried out. The covering film can then be removed to allow the structural feature to move freely.

Although the present invention has been exemplified with respect to silicon on insulator materials and appropriate processing for such materials, it is apparent to those of ordinary skill that the same processing may be carried out with other types of substrates including other semiconductor materials, and other sacrificial layer materials.

It is understood that the invention is not confined to the particular embodiments set forth herein as illustrative, but embraces all such forms thereof as come within the scope of the following claims.

What is claimed is:

1. A method of forming nanomechanical structures comprising:
   (a) providing a nanomechanical structural feature supported on a layer of sacrificial material and connected to a larger structural element;

(b) applying a film onto the structural feature by energy beam assisted deposit of material from a vapor through which the beam passes to cover at least a portion of the structural feature;

(c) applying a wet etchant to the structural feature covered by the film and to the sacrificial layer supporting the structural feature, the wet etchant selected to etch the sacrificial layer material preferentially as compared to the structural feature and to the film covering it to leave the structural feature supported by its connection to the larger structural element; and (d) removing the covering film from the structural feature.

2. The method of claim 1 wherein the vapor contains carbon and wherein the film deposited on the structural feature comprises a carbon film.

3. The method of claim 2 wherein the carbon film is deposited to a thickness of at least 5 nm.

4. The method of claim 2 wherein the energy beam is an electron beam that is scanned over the structural feature.

5. The method of claim 2 wherein the carbon film is deposited to a thickness of 40 to 50 nm.

6. The method of claim 2 wherein removing the covering film of carbon is carried out by oxygen plasma etching.

7. The method of claim 2 wherein the structural feature is formed of silicon, the sacrificial layer is formed of silicon dioxide, and the wet etchant is buffered hydrofluoric acid.

8. The method of claim 1 wherein the structural feature has a cross-sectional dimension that is 500 nm or less.

9. The method of claim 1 wherein the energy beam is a scanning electron beam that is scanned over the structural feature.

10. The method of claim 9 wherein the electron beam is provided by a scanning electron microscope.

11. The method of claim 10 wherein the vapor is an organic vapor present in a sample chamber of the scanning electron microscope.

12. The method of claim 9 wherein the electron beam is scanned over the structural feature and over an opening between the structural feature and adjacent structure to form a film extending over the opening between and connecting the structural feature and the adjacent structure.

13. A method of forming nanomechanical structures comprising:

(a) providing a nanomechanical structural feature having at least one cross-sectional dimension of 500 nm or less, supported on a layer of sacrificial material and connected to a larger structural element;

(b) applying a film of carbon onto the structural feature by scanning an electron beam over the structural feature to deposit material from a vapor containing carbon through which the beam passes to cover at least a portion of the structural feature;

(c) applying a wet etchant to the structural feature covered by the film and to the sacrificial layer supporting the structural feature, the wet etchant selected to etch the sacrificial layer material preferentially as compared to the structural feature and to the film covering it to leave the structural feature supported by its connection to the larger structural element; and (d) removing the covering film from the structural feature by oxygen plasma etching.

14. The method of claim 13 wherein the carbon film is deposited to a thickness of at least 5 nm.

15. The method of claim 13 wherein the carbon film is deposited to a thickness of 40 to 50 nm.

16. The method of claim 13 wherein the structural feature is formed of silicon, the sacrificial layer is formed of silicon dioxide, and the wet etchant is buffered hydrofluoric acid.

17. The method of claim 13 wherein the structural feature has a cross-sectional dimension that is 100 nm or less.

18. The method of claim 13 wherein the electron beam is provided by a scanning electron microscope.

19. The method of claim 18 wherein the vapor is an organic vapor present in a sample chamber of the scanning electron microscope.

20. The method of claim 13 wherein the electron beam is scanned over the structural feature and over an opening between the structural feature and adjacent structure to form a film extending over the opening between and connecting the structural feature and the adjacent structure.

21. A method of forming structural features on a semiconductor base comprising:

(a) providing a structural feature on a semiconductor base;

(b) applying a film of carbon onto the structural feature by scanning an electron beam over the structural feature to deposit material from a vapor containing carbon through which the beam passes to cover at least a portion of the structural feature;

(c) applying a wet etchant to the structural feature covered by the film and to the semiconductor base, the wet etchant selected to etch material of the semiconductor base preferentially as compared to the film covering the structural feature; and (d) removing the covering carbon film from the structural feature.

22. The method of claim 21 wherein removing the carbon film is carried out by oxygen plasma etching.

23. The method of claim 21 wherein the carbon film is deposited to a thickness of at least 5 nm.

24. The method of claim 21 wherein the carbon film is deposited to a thickness of 40 to 50 nm.

25. The method of claim 21 wherein the structural feature is formed of silicon and the wet etchant is buffered hydrofluoric acid.

26. The method of claim 21 wherein the structural feature has a cross-sectional dimension that is 500 nm or less.

27. The method of claim 21 wherein the electron beam is provided by a scanning electron microscope.

28. The method of claim 27 wherein the vapor is an organic vapor present in a sample chamber of the scanning electron microscope.

29. The method of claim 21 wherein the electron beam is scanned over the structural feature and over an opening between the structural feature and adjacent structure to form a film extending over the opening between and connecting the structural feature and the adjacent structure.

30. A method of releasably holding structural features on a base comprising:

(a) providing a structural feature on a surface of a base;

(b) applying a film of carbon onto the structural feature by energy beam assisted deposit of material from a vapor containing carbon through which the beam passes to cover at least a portion of the structural feature and an adjoining portion of the surface of the base to hold the structural feature in place on the base; and (c) removing the covering carbon film from the structural feature.

31. The method of claim 30 wherein removing the carbon film is carried out by oxygen plasma etching.

32. The method of claim 30 wherein the carbon film is deposited to a thickness of at least 5 nm.

33. The method of claim 30 wherein the carbon film is deposited to a thickness of 40 to 50 nm.

34. The method of claim 30 wherein the structural feature is not directly attached to the surface of the base and is free to move after the covering carbon film is removed from the structural feature.

35. The method of claim 30 wherein the structural feature has a cross-sectional dimension that is 500 nm or less.

36. The method of claim 30 wherein the energy beam is an electron beam that is scanned over the structural feature and the adjoining portion of the surface of the base.

37. The method of claim 36 wherein the electron beam is provided by a scanning electron microscope.

38. The method of claim 37 wherein the vapor is an organic vapor present in a sample chamber of the scanning electron microscope.

39. The method of claim 36 wherein the electron beam is scanned over the structural feature and over an opening between the structural feature and adjacent structure to form a film extending over the opening between and connecting the structural feature and the adjacent structure.

* * * * *

UNITED STATES PATENT AND TRADEMARK OFFICE
CERTIFICATE OF CORRECTION

PATENT NO. : 7,041,611 B2 Page 1 of 1
APPLICATION NO. : 10/802259
DATED : May 9, 2006
INVENTOR(S) : Robert H. Blick and Daniel R. Koenig It is certified that error appears in the above-identified patent and that said Letters Patent is hereby corrected as shown below:

IN THE CLAIMS:

Column 8, line 14, claim 20: Replace "aflim," with --a film--.

Signed and Sealed this

Twelfth Day of December, 2006

JON W. DUDAS
*Director of the United States Patent and Trademark Office*